(12) United States Patent
Ebeida

(10) Patent No.: US 10,776,537 B1
(45) Date of Patent: *Sep. 15, 2020

(54) CONSTRUCTING A CONFORMING VORONOI MESH FOR AN ARBITRARILY-SHAPED ENCLOSED GEOMETRIC DOMAIN

(71) Applicant: National Technology & Engineering Solutions of Sandia, LLC, Albuquerque, NM (US)

(72) Inventor: Mohamed Salah Ebeida, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 253 days.

This patent is subject to a terminal disclaimer.

(21) Appl. No.: 15/634,734

(22) Filed: Jun. 27, 2017

(51) Int. Cl.
*G06F 30/20* (2020.01)
*G06T 11/20* (2006.01)

(52) U.S. Cl.
CPC .......... *G06F 30/20* (2020.01); *G06T 11/206* (2013.01)

(58) Field of Classification Search
CPC ............................ G06F 17/5018; G06T 17/20
See application file for complete search history.

(56) References Cited

U.S. PATENT DOCUMENTS 6,968,299 B1 * 11/2005 Bernardini ............ G06F 17/175
345/424
8,212,814 B2    7/2012 Branets et al.
8,674,984 B2    3/2014 Ran et al.
8,818,780 B2    8/2014 Calvert et al.
9,103,194 B2    8/2015 Khvoenkova et al.
2014/0192049 A1 * 7/2014 Stanley .................. G06T 15/10
345/420

(Continued)

OTHER PUBLICATIONS

Mitchell, Scott A., et al. Efficient Probability of Failure Calculations for QMU using Computational Geometry LDRD 13-0144 Final Report. No. SAND2015-7976. Sandia National Lab.(SNL-NM), Albuquerque, NM (United States), 2015. (Year: 2015).*

(Continued)

*Primary Examiner* — Omar F Fernandez Rivas
*Assistant Examiner* — David A Hopkins
(74) *Attorney, Agent, or Firm* — Medley, Behrens & Lewis, LLC

(57) ABSTRACT

A computing system is described herein, where the computing system includes a processor and memory storing instructions that, when executed by the processor, cause the processor to perform the following acts: 1) receiving a computer-implemented definition of an enclosed geometric domain, wherein the geometric domain is two-dimensional; 2) determining locations of seeds for the enclosed geometric domain; 3) decomposing the enclosed geometric domain into a conforming Voronoi mesh based on the locations of the seeds, wherein the conforming Voronoi mesh comprises Voronoi cells, and further wherein the conforming Voronoi mesh is bounded by the enclosed domain; and 4) performing a numerical simulation to generate simulation results, wherein the numerical simulation is based on at least one Voronoi cell in the Voronoi cells of the conforming Voronoi mesh.

14 Claims, 12 Drawing Sheets

(56) References Cited

U.S. PATENT DOCUMENTS

2015/0260017 A1\* 9/2015 Ding ...................... E21B 43/00
                                                                703/10

OTHER PUBLICATIONS

Mitchell et al., "VoroCrust: Simultaneous Surface Reconstruction and Volume Meshing with Voronoi cells", 2015, POEMS15: Workshop on Polytopal Element Methods in Mathematics and Engineering, http://www.poems15.gatech.edu/sites/default/files/talks/Mitchell-slides.pdf (Year: 2015).\*
Eppstein, David. "Global optimization of mesh quality." Tutorial at the 10th International Meshing Roundtable10 10 (2001): 13. (Year: 2001).\*
Kim, Jeong-Hun, et al. "Adaptive mesh generation by bubble packing method." Structural Engineering and Mechanics 15.1 (2003): 135-150. (Year: 2003).\*
Hubbard, Philip M. "Approximating polyhedra with spheres for time-critical collision detection." ACM Transactions on Graphics (TOG) 15.3 (1996): 179-210. (Year: 1996).\*
Andrew Gillette, "The State of the Art in Polytopal Finite Element Methods", University of Arizona, Dec. 2015, SIAM Conference on Analysis of PDEs, Scottsdale AZ, https://www.math.arizona.edu/~agillette/research/apde2015-talk.pdf (Year: 2015).\*
Beckwith, Frank. Verification and Large Deformation Analysis Using the Reproducing Kernel Particle Method. No. SAND-2015-8355. Sandia National Lab.(SNL-NM), Albuquerque, NM (United States), 2015. (Year: 2015).\*
Ahmed Abdelrazek, "VoroCrust Geometry: 3D polyhedral meshing with true Voronoi cells conforming to prescribed surface points", 2015, https://www.sandia.gov/~samitch/_assets/documents/pdfs/VC-USNCCM2015.pdf (Year: 2015).\*
Mitchell, Scott A., et al. Delaunay quadrangulation by two-coloring vertices-extended version with quad-quality proofs appendix. No. SAND2014-16625C. Sandia National Lab.(SNL-NM), Albuquerque, NM (United States), 2014. (Year: 2014).\*
Mitchell, Scott A., and Mohamed Salah Ebeida. Uniform Random Voronoi Meshes for Ensembles of Lagrangian Fracture Simulations. No. SAND2011-5141C. Sandia National Lab.(SNL-NM), Albuquerque, NM (United States), 2011. (Year: 2011).\*
Ebeida, Mohamed Salah, et al. Unleashing the Power of Voronoi Decompositions in low and high dimensions. No. SAND2015-2440D. Sandia National Lab.(SNL-NM), Albuquerque, NM (United States), 2015. (Year: 2015).\*
Dey, Tamal K., and Lei Wang. "Voronoi-based feature curves extraction for sampled singular surfaces." Computers & Graphics 37.6 (2013): 659-668. (Year: 2013).\*
Liebling, Thomas M., and Lionel Pournin. "Voronoi diagrams and Delaunay triangulations: Ubiquitous siamese twins." Documenta Mathematics, ISMP (2012): 419-431. (Year: 2012).\*
Instructables, Hand-Drawn Voronoi Diagrams, https://www.instructables.com/id/Hand-Drawn-Voronoi-Diagrams/, Accessed May 23, 2019 (Year: 2019).\*
Shimada, Kenji, and David C. Gossard. "Bubble mesh: automated triangular meshing of non-manifold geometry by sphere packing." Proceedings of the third ACM symposium on Solid modeling and applications. ACM, 1995. (Year: 1995).\*
Li, Xiang-Yang, Shang-Hua Teng, and Alper Üngör. "Biting: Advancing front meets sphere packing." International Journal for Numerical Methods in Engineering 49.1-2 (2000): 61-81. (Year: 2000).\*
Shimada, Kenji. Physically-based mesh generation: automated triangulation of surfaces and volumes via bubble packing. Diss. Massachusetts Institute of Technology, 1993. (Year: 1993).\*
Liu, Jianfei, Shuixiang Li, and Yongqiang Chen. "A fast and practical method to pack spheres for mesh generation." Acta Mechanica Sinica 24.4 (2008): 439-447. (Year: 2008).\*
Miller, Gary L., et al. "Control volume meshes using sphere packing: Generation, refinement and coarsening." (1996): 47-61. (Year: 1996).\*

\* cited by examiner

CONSTRUCTING A CONFORMING VORONOI MESH FOR AN ARBITRARILY-SHAPED ENCLOSED GEOMETRIC DOMAIN

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Subdividing a geometric domain into polyhedral elements is desirable in numerous technical fields. For example, it is desirable to subdivide a geometric domain into polyhedral elements when performing a three-dimensional numerical simulation using polyhedral discretization. Robustness of conventional processes for performing domain decomposition (e.g., the subdivision of a geometric domain into polyhedral elements) is not trivial. Generally, domain decomposition breaks down a domain into a finite number of cells with certain desired properties, such as positive Jacobian, element convexity, and planar facets. A domain decomposition also defines how a point in the domain is assigned to a cell, and how each cell in the domain decomposition identifies cells in close proximity thereto.

Several different approaches have been proposed for performing domain decomposition over geometric domains. These approaches, however, are associated with numerous deficiencies. In particular, conventional Voronoi domain decomposition (VDD) approaches rely on clipping, where facets of one or more Voronoi cells extend beyond a boundary of the geometric domain, and such facets are clipped. This may result in a clipped Voronoi cell having undesirable properties, such as a relatively large aspect ratio. Additionally, clipping may result in creation of cells that are nonconvex and/or not star-shaped. Thus, while Voronoi domain decomposition of a geometric domain may produce desirable properties for many applications, there is currently a lack of a robust approach for performing Voronoi domain decomposition that does not rely upon clipping.

SUMMARY

The following is a brief summary of subject matter that is described in greater detail herein. This summary is not intended to be limiting as to the scope of the claims.

Described herein are various technologies pertaining to performing Voronoi domain decomposition without relying on clipping. More particularly, a computing system receives a two-dimensional (2D) domain descriptor, such as a Computer-Aided Design (CAD) file that defines an enclosed 2D geometric domain. The approach described herein for performing Voronoi domain decomposition is robust, such that the enclosed domain may have an arbitrary shape. The computing system identifies where seeds are to be located with respect to the enclosed domain. As will be described herein, at least some seeds are located exterior to the enclosed domain, resulting in formation of facets that are coincident with a border edge of the enclosed domain.

More specifically, the computing system can identify sharp corners of the enclosed domain, wherein sharp corners exist where edges (lines) of the enclosed domain intersect and the interior angle of intersection is less than some angle threshold, for example: 150°. Thereafter, the computing system centers circles over these sharp corners, where a radius of each circle is determined based on a set of rules. For instance, a rule in the set of rules can indicate that the circle may only intersect the edges that form the sharp corner that is covered by the circle. In another example, a second rule in the set of rules can indicate that a circle may not intersect with any other circle that is centered over a sharp corner of the enclosed domain. Hence, it can be ascertained that at least a portion of each edge in the enclosed domain remains uncovered.

Subsequently, the computing system covers the uncovered portions of the edges with circles, where the circles are centered over points on the edges. More particularly, the computing system can uniformly randomly select an edge from amongst all edges of the enclosed domain, and the computing system can randomly select a point on the selected edge. When the selected point is already covered by a circle, the computing system discards the point and the sampling process is repeated. When the point is uncovered, the computing system centers a circle over the point. The computing system selects the radius of the circle based on a second set of rules. For instance, the circle can only intersect the edge upon which the point lies. Further, the circle is prevented from intersecting another circle that is not centered on a point on the edge. Additionally, the radius of the circle may be precluded from a being over a predefined threshold. Using the above described process, the computing system covers each portion of each edge of the enclosed domain with at least one circle.

Thereafter, the computing system identifies intersections of circles, and labels these intersections as being boundary seeds for use when performing Voronoi tessellation. When two circles intersect, a pair of intersecting points is formed, thereby forming a pair of boundary seeds, where one point in the pair is located inside the enclosed domain, while the other point in the pair is located exterior to the enclosed domain. Thus, each boundary seed inside the enclosed domain is mirrored by another boundary seed outside of the enclosed domain. This mirroring of boundary seeds ensures that a facet of a resultant Voronoi cell is coincident with an edge of the domain-therefore, clipping of Voronoi cells is unnecessary.

The computing system can undertake further processing to improve properties of Voronoi cells in the enclosed domain. Specifically, the computing system can add interior seeds to the interior of enclosed domains, where the interior seeds are positioned such that they do not interfere with the facets that are coincident with edges of the enclosed domain. More particularly, any seed inserted in the interior of the enclosed domain must be further from any point on any facet that is coincident with an edge than the boundary seed corresponding to the facet. This ensures that the insertion of the seed does not alter a facet formed between a boundary seed pair. The computing system can populate the interior of the enclosed domain with interior seeds by randomly sampling a point from the interior of the domain, checking to ensure that this point does not violate the boundary condition referenced above, and further checking to ensure that the point is at least a threshold distance from any other previously inserted interior seed. When such conditions are met, the computing system places a seed at the sampled point, and the process repeats until the interior of the enclosed domain is populated with a sufficient number of interior seeds. Populating the interior of the enclosed domain with several interior seeds results in formation of Voronoi cells with bounded aspect ratios. Once the computing system has populated the interior of the enclosed domain with interior seeds, the computing system performs a Voronoi tessellation, thereby creating a conforming Voronoi mesh, with unclipped elements, that is bounded by the enclosed domain.

The computing system may then perform a numerical simulation based on this Voronoi mesh. There are many different applications for which performing a numerical simulation based on the Voronoi mesh are desired. Examples include numerical simulations of two-dimensional spatio-temporal spaces, reconnection-based arbitrary Lagrangian-Eulerian methods for multi-material high-speed flows from strong shear deformations, polyhedral discretization for cohesive fracture simulations, etc.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
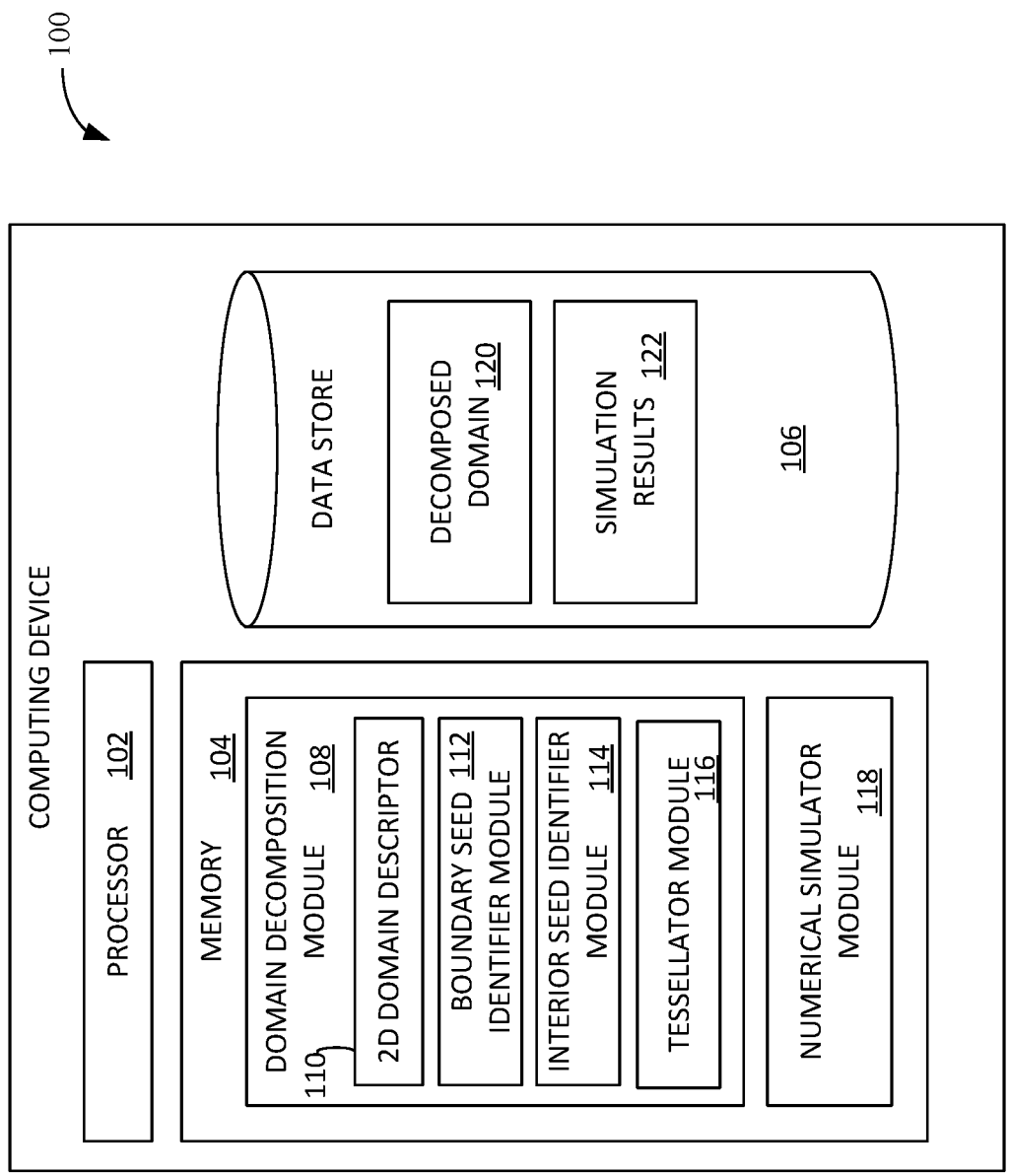
FIG. 1 is a functional block diagram of an exemplary computing device that is configured to perform numerical simulation based on a conforming Voronoi mesh.

Various technologies pertaining to performing numerical simulations based on a conforming Voronoi mesh, and further pertaining to constructing such Voronoi mesh, are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component", "system", and "module" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

Described herein are various technologies pertaining to performing a numerical simulation utilizing a computing device, wherein the numerical simulation receives as input information pertaining to a conforming Voronoi mesh that is bounded by a predefined arbitrarily-shaped two-dimensional enclosed geometric domain. The conforming Voronoi mesh is constructed by: 1) determining locations of boundary seeds (where facets of Voronoi cells are coincident with boundaries of the enclosed domain); and 2) optionally, determining locations of interior seeds that result in the Voronoi mesh having Voronoi cells with bounded aspect ratios.

With reference now to FIG. 1, a functional block diagram of an exemplary computing device 100 is illustrated. The computing device 100 includes a processor 102 and memory 104 that is operably coupled to the processor 102. The computing device 100 also includes a data store 106 that is operably coupled to the processor 102 and/or the memory 104. The memory 104 has loaded therein a domain decomposition module 108 that is configured to perform Voronoi domain decomposition (VDD) with respect to an enclosed two-dimensional (2D) geometric domain of arbitrary shape. The domain decomposition module 108 receives a two-dimensional domain descriptor 110, which defines the above-mentioned enclosed domain. The two-dimensional domain descriptor 110, for example, may be a Computer-aided Design (CAD) file, which can include an electronic representation of the enclosed domain. More specifically, the 2D domain descriptor 110 comprises lines defined by start and end positions, wherein the lines form the enclosed domain.

The domain decomposition module 108 comprises a boundary seed identifier module 112 that is configured to determine locations of boundary seeds with respect to the enclosed domain. More specifically, these boundary seeds are seeds which can be employed by a Voronoi tessellation algorithm to create a Voronoi mesh that comprises Voronoi cells, wherein each cell includes a seed, and further wherein such Voronoi cells each have a facet that is coincident with at least a portion of an edge (boundary) of the enclosed domain. Collectively, the above-mentioned facets are coincident with an entirety of all edges of the enclosed domain, such that the resultant Voronoi mesh is conforming, and clipping need not be undertaken.

The domain decomposition module 108 further comprises an interior seed identifier module 114 that populates the interior of the enclosed domain with interior seeds (which are in addition to the boundary seeds). The interior seed identifier module 114 positions the interior seeds inside of the enclosed domain such that Voronoi cells that are "grown" using these Voronoi seeds in the resultant conforming Voronoi mesh have a bounded aspect ratio (e.g., an aspect ratio that approaches 1). The domain decomposition module 108 also includes a tessellator module 116 that constructs the conforming Voronoi mesh by performing Voronoi tessellation using the boundary seeds identified by the boundary seeds identifier module 112 and the interior seeds generated by the interior seed identifier module 114.

The memory 104 also includes a numerical simulator module 118 that can perform a numerical simulation based on the conforming Voronoi mesh constructed by the tessellator module 116. The numerical simulator module 118 can be configured to perform any suitable two-dimensional numerical simulation using polygonal discretization, wherein applications include, but are not limited to, reconnection-based arbitrary Lagrangian-Eulerian methods for multi-material high-speed flows with strong shear deformations and polygon discretization for two-dimensional cohesive fracture simulations. The numerical simulator module 118 may also be configured to perform particle simulations based upon the conforming Voronoi mesh output by the tessellator module 116. For instance, particle-based flow simulations employ particles to define weighted Voronoi cells for finite element structure analysis.

Operation of the computing device 100 is now set forth. The computing device receives the two-dimensional domain descriptor 110, which, as mentioned above, may be a CAD file. The boundary seed identifier module 112 determines positions of boundary seeds with respect to the enclosed domain defined by the two-dimensional domain descriptor 110, wherein, as mentioned above, boundary seeds are those whose Voronoi cells, when constructed, each have a facet that is coincident with at least a portion of an edge of the enclosed domain. Boundary seeds identified by the boundary seed identifier module 112 are in pairs: one boundary seed inside the enclosed domain and one boundary seed outside of the enclosed domain, wherein the boundary seeds are equidistant to any point along an edge that separates the boundary seeds in the boundary seed pair. This mirroring of boundary seeds about the edge ensures that a facet, which is between the Voronoi cells for the boundary seeds in the boundary seed pair, is coincident with at least a portion of the edge that separates the boundary seeds in the boundary seed pair. Operation of the computing device 100 generally, and the domain decomposition module 108 specifically, is described in greater detail with respect to FIGS. 2-9.

FIGS. 2-4, 6, 8, and 10 illustrate exemplary methodologies relating to constructing a conforming Voronoi mesh that is bounded by a predefined, arbitrarily-shaped enclosed domain. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Figure 2:
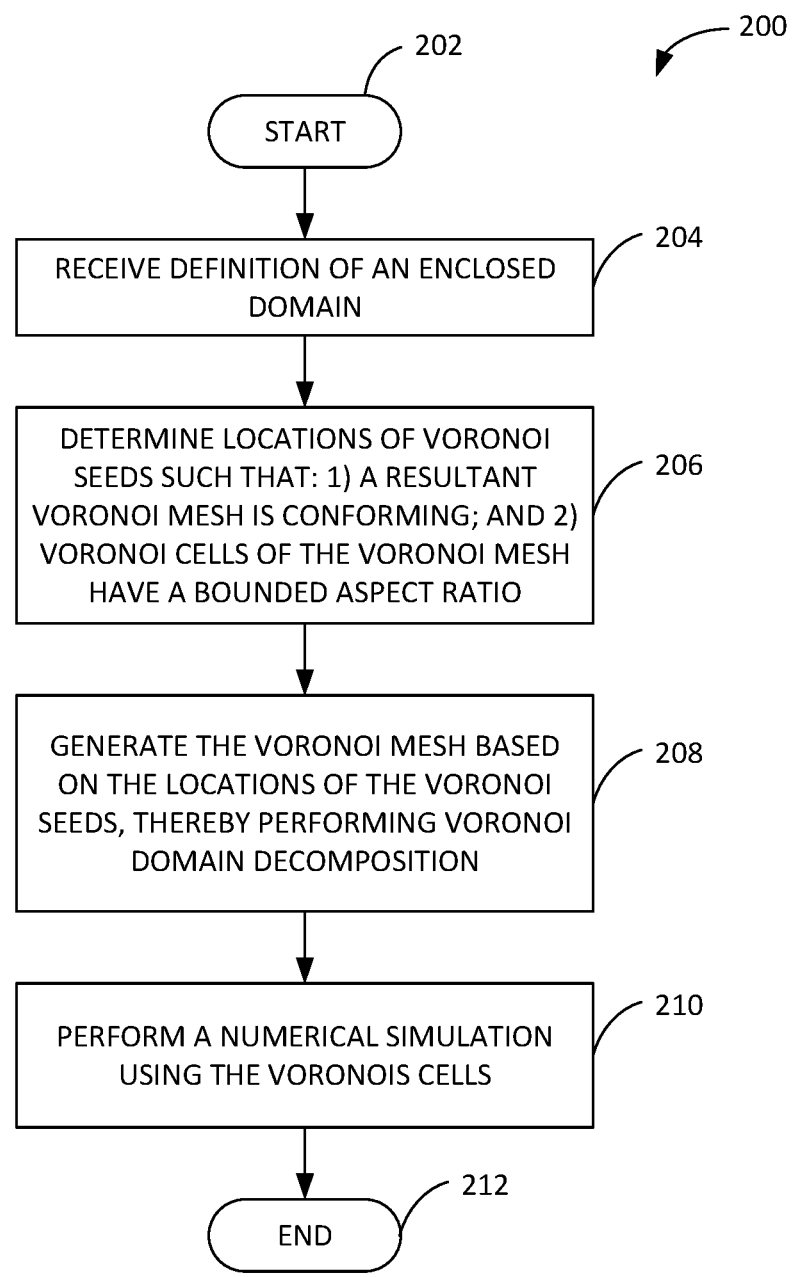
FIG. 2 is a flow diagram illustrating an exemplary methodology for performing a numerical simulation based on a conforming Voronoi mesh.

Referring to FIG. 2, an exemplary methodology 200 that is performed by the computing device 100 is illustrated. The methodology 200 starts at 202, and at 204 a definition of an enclosed 2D geometric domain is received. At 206, locations of seeds for use when performing Voronoi tessellation are determined such that, 1) a resultant Voronoi mesh constructed based on these seeds is conforming and is bounded by the enclosed domain; and 2) at least some Voronoi cells in the resultant Voronoi mesh have a bounded aspect ratio.

At 208, the Voronoi mesh is generated based on the determined locations of the Voronoi seeds. Hence, a Voronoi domain decomposition is performed, the Voronoi mesh being conforming. At 210, a numerical simulation is performed based on the Voronoi mesh, and the methodology 200 completes at 212.

Figure 3:
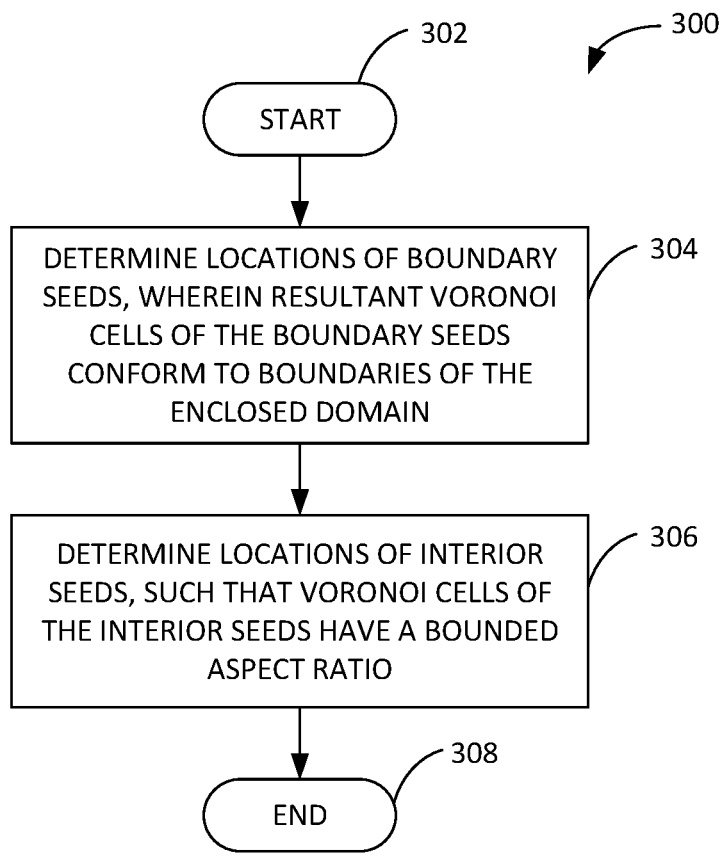
FIG. 3 is a flow diagram illustrating an exemplary methodology for determining locations of seeds that are used to construct a conforming Voronoi mesh in an arbitrary two-dimensional (2D) enclosed geometric domain.

Now referring to FIG. 3, an exemplary methodology 300 performed by the domain decomposition module 108 in connection with determining locations of boundary seeds and interior seeds is illustrated. The methodology 300 starts at 302, and at 304, locations of boundary seeds are determined, wherein Voronoi cells of the boundary seeds in a resultant Voronoi mesh have at least one facet that is coincident with at least a portion of an edge of the enclosed domain, and further wherein these facets, collectively, define the boundary of the enclosed domain. At 306, locations of interior seeds are determined, such that Voronoi cells of the interior seeds have a bounded aspect ratio. The methodology 300 completes at 308.

Figure 4:
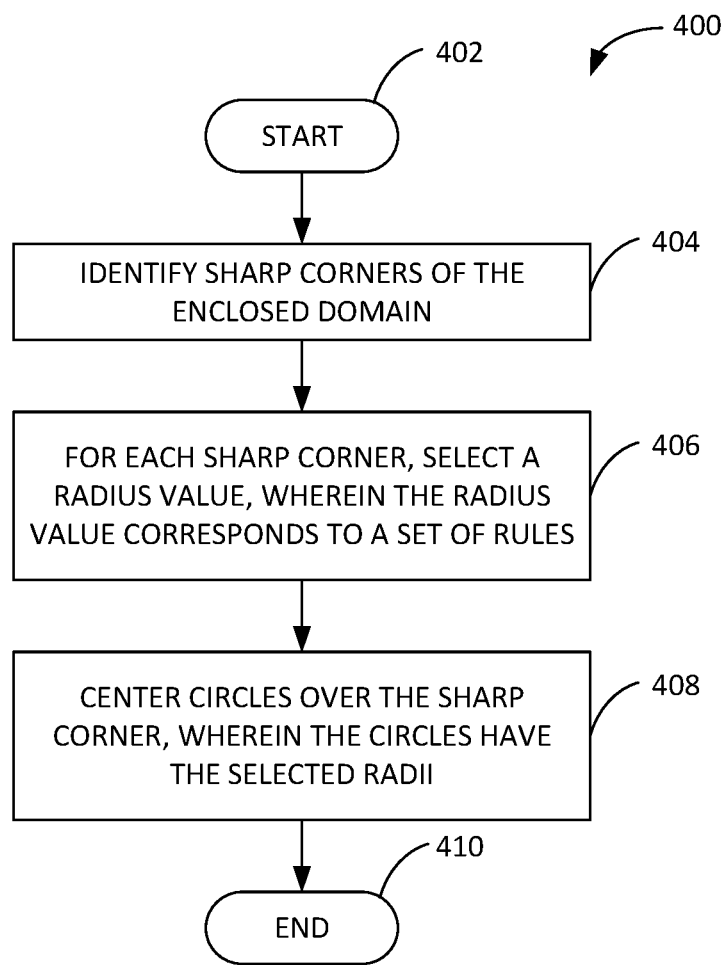
FIG. 4 is a flow diagram that illustrates an exemplary methodology for determining locations of seeds that are employed to form a conforming Voronoi mesh in an arbitrary 2D enclosed geometric domain.

Now referring to FIG. 4, an exemplary methodology 400 that is performed by the boundary seed identifier module 112 is illustrated. The methodology 400 starts at 402, and at 404 each sharp corner of the enclosed domain are identified. A sharp corner exists at the intersection of two edges (lines) of the enclosed domain. For example, a sharp corner exists when an interior angle at the intersection of two intersecting lines is less than some angle threshold, such as about 150°. In another example, a sharp corner exists at the intersection of any two lines in the enclosed domain, regardless of interior angle.

At 406, for each sharp corner, a radius value is selected, wherein the radius value is selected based on a set of rules. More specifically, circles are to be centered over each sharp corner of the enclosed domain, wherein the radius of each circle is determined based on the set of rules mentioned above. Generally, the radius of each circle must respect the local feature size of the domain defined in the two-dimensional domain descriptor 110. With particularity, a first rule in the set of rules can require that the radius of a circle is selected such that the circle does not intersect any edges other than the two edges that form the sharp corner upon which the circle is centered. A second rule in the set of rules can require that the circle does not intersect or be tangential to any other circle that is centered on another sharp corner in the two-dimensional domain. Optionally, a third rule in the set of rules can require that the radius be less than a threshold maximum radius value.

At 408, the circles with the selected radius values are centered over the sharp corners of the enclosed domain. The methodology 400 completes at 410.

Figure 5:
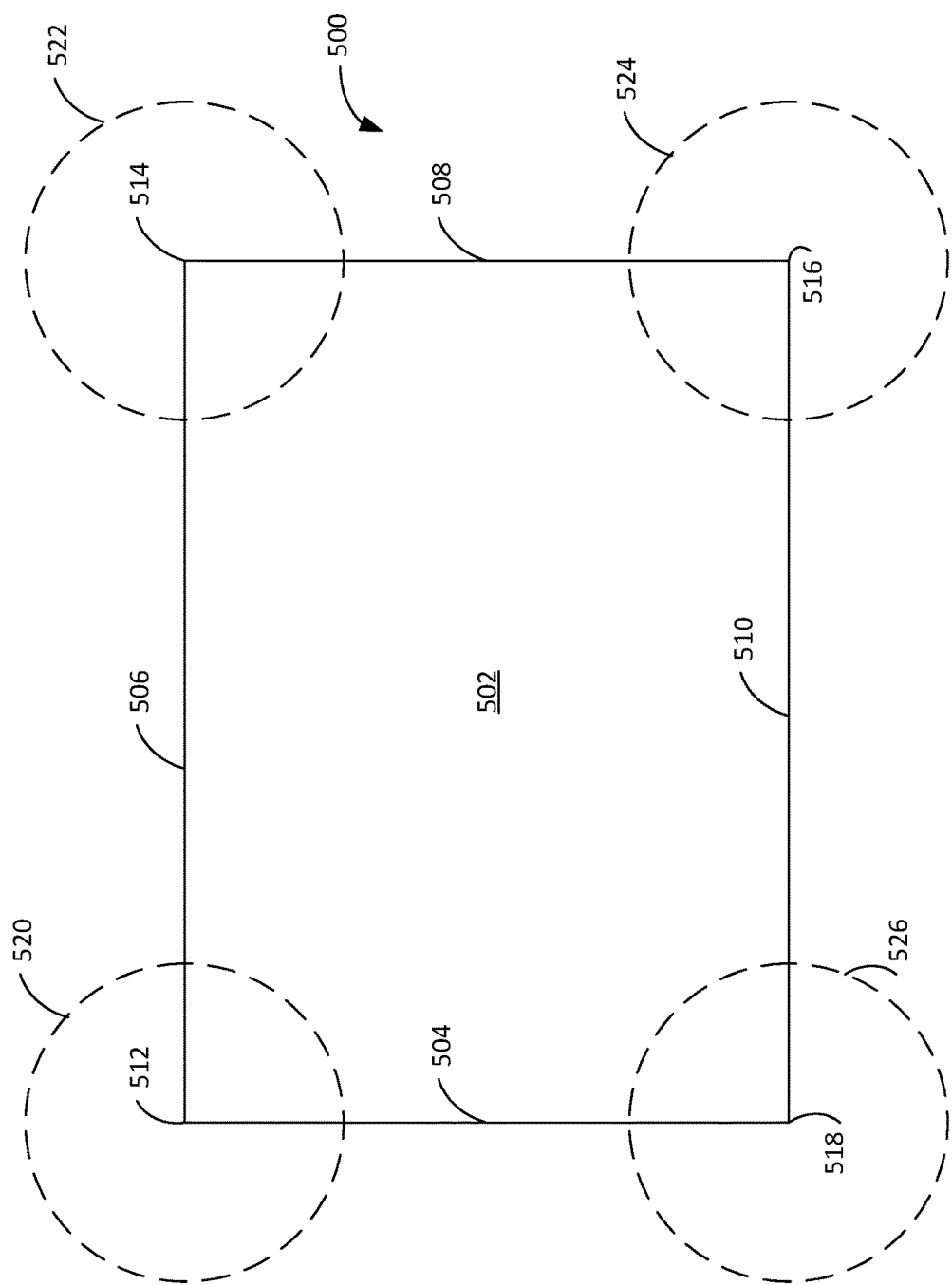
FIG. 5 is a schematic of an exemplary enclosed geometric domain with circles positioned over sharp corners of the domain.

Now referring to FIG. 5, an exemplary schematic that depicts operation of the methodology 400 with respect to an enclosed domain is illustrated. In the exemplary schematic 500, the enclosed domain 502 is a rectangle having four edges 504-510 creating four sharp corners 512-518. Responsive to identifying the sharp corners 512-518, the boundary seed identifier module 112 centers respective circles 520-526 over the sharp corners 512-518 in accordance with the rules set forth above. For example, the boundary seed identifier module 112 can perform the process sequentially, by first identifying a sharp corner (e.g., the sharp corner 512), and immediately thereafter placing the circle 520 over the sharp corner 512 using the rules set forth above. That is, the circle 520 can initially be set with a smallest possible radius and then expanded until: 1) the circle 520 intersects an edge other than the edge 504 or 506; 2) the circle 520 intersects a circle that has previously been centered on a sharp corner; or 3) the radius has reached the predefined maximum. The boundary seed identifier module 112 may then move to a next sharp corner and the process can be repeated until circles have been centered over all sharp corners of the enclosed domain 502. As can be ascertained, due to the rules specified above, at least a portion of each of the edges 504-510 remains uncovered by any of the circles to 520-526. In another approach, the boundary seed identifier module 112 can perform the process of centering circles over sharp corners in parallel, wherein the boundary seed identifier module 112 identifies all the sharp corners 512-516, centers a circle over each of the sharp corners, and then (in parallel) expands the radii of the circles. When a circle violates one of the rules, the boundary seed identifier module 112 can reduce the radius of the circle and thereafter keep such radius static while continuing to expand other circles. Other approaches are also contemplated.

Figure 6:
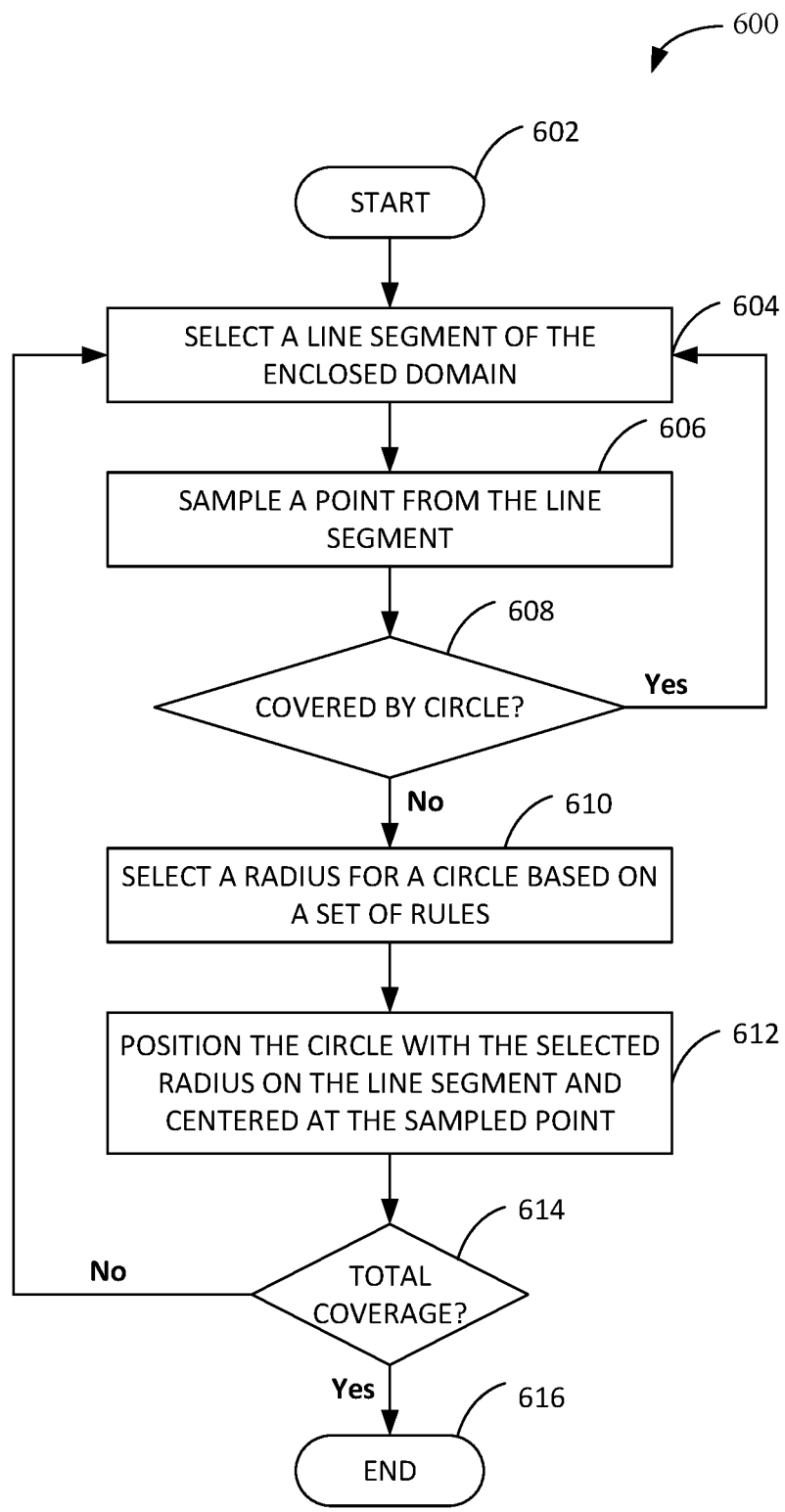
FIG. 6 is a flow diagram illustrating an exemplary methodology for determining locations of boundary seeds that are used to construct a conforming Voronoi mesh in an arbitrarily-shaped enclosed domain.

Now referring to FIG. 6, an exemplary methodology 600 that is performed by the boundary seed identifier module 112 in connection with identifying locations of boundary seeds with respect to the enclosed domain is illustrated. Performance of the methodology 600 subsequent to performance of the methodology 400 results in each point on each edge of the enclosed domain being covered by at least one circle. The methodology 600 starts at 602, and at 604 a line segment (which is at least a portion of an edge) of the enclosed domain is selected. For example, the line segment can be uniformly randomly selected, wherein each line segment is assigned a weight that is based on length of the line segment. At 606, a point is sampled from the selected line segment, wherein the point can be a randomly selected from the line segment. At 608, a determination is made regarding whether the point is already covered by a circle. If it is determined at 608 that the point is already covered by a circle, then the point is discarded and the methodology returns to 604, where another line segment is uniformly randomly selected.

If, however, it is determined at 608 that the sampled point is not covered by a circle, then at 610 a radius for a circle is selected based on a second set of rules, wherein the circle is to be centered at the sampled point. For instance, the second set of rules can indicate that the circle cannot intersect or be tangential to any sharp corner, and may further not intersect or be tangential to any edge other than the edge that includes the line segment. Further, the second set of rules may indicate that the circle is not to be within a threshold distance of another edge. Still further, the second set of rules can indicate that the circle is not to encapsulate any other circle. Finally, the second set of rules can optionally indicate that the radius is not to exceed a maximum radius. At 612, responsive to selecting the radius for the circle, the circle with the selected radius is positioned on the line segment and centered at the sampled point. At 614, a determination is made regarding whether each point in the enclosed domain is covered by a circle. If each point is not covered, then the methodology returns to 604. If it is determined at 614 that each point of the enclosed domain is covered by a circle, the methodology 600 completes at 616.

Various optimization approaches can be employed by the boundary seed identifier module 112 when covering each point along the edges of the enclosed domain with at least one circle. For instance, initially, a line segment may be an entirety of an edge of the enclosed domain. After some threshold number of consecutive times that a sampled point on the line segment is identified as being covered by a circle, the line segment can be partitioned into some smaller line segments. For instance, the line segment may be divided in half, thereby forming two line segments. Subsequently, each of the two line segments can be analyzed to ascertain if each point in the line segment is covered by a circle. Line segments with each point covered by at least one circle can be discarded from further consideration, leaving only the line segment that is at least partially uncovered. This process can be repeated on a per-line segment basis (e.g., line segment by line segment) until all points on all edges of the enclosed domain are covered by at least one circle. In another embodiment, rather than analyzing line segments one by one, when there are some threshold number of consecutive "misses" (where a sampled point is already covered by a circle), each line segment of the domain can be partitioned into multiple line segments, such that line segments that are entirely covered are identified in batches. Such process can be repeated until all points of the edges of the enclosed domain are covered by circles.

Figure 7:
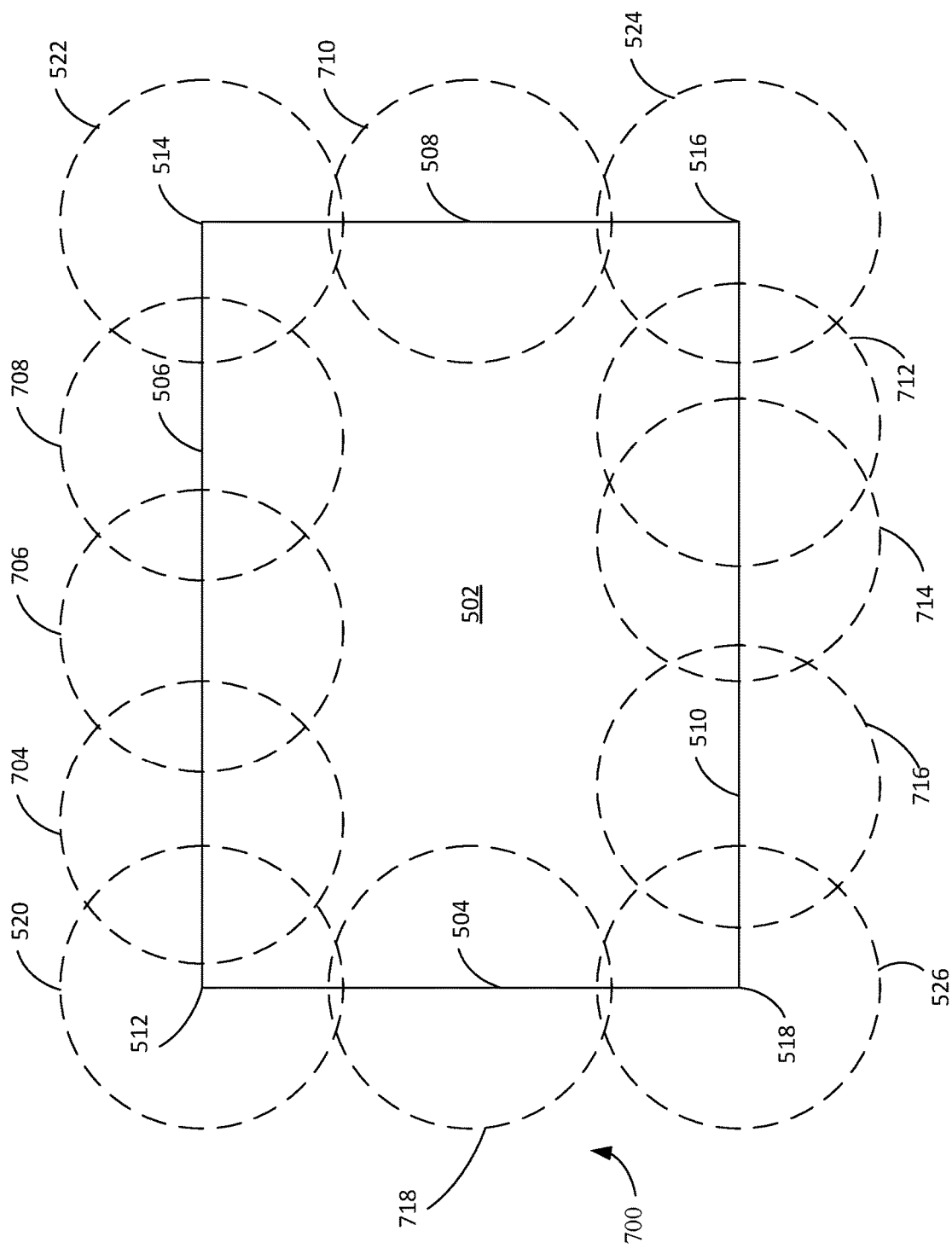
FIG. 7 is a schematic that illustrates circles that cover edges of an enclosed domain.

Referring now to FIG. 7, an exemplary schematic 700 that depicts the exemplary enclosed domain 502 with its edges 504-510 entirely covered by circles is illustrated. The schematic 700 depicts the circles 520-526 centered at the sharp corners 512-518. The schematic 700 additionally illustrates circles 704-718 placed over portions of the edges 504-510, such that each point in each edge is covered by at least one of the circles 520-526 or 704-718. The circles 704-718 are positioned on the edges of the enclosed domain 502 by the boundary seed identifier module 112 utilizing the methodology 600 set forth above.

Figure 8:
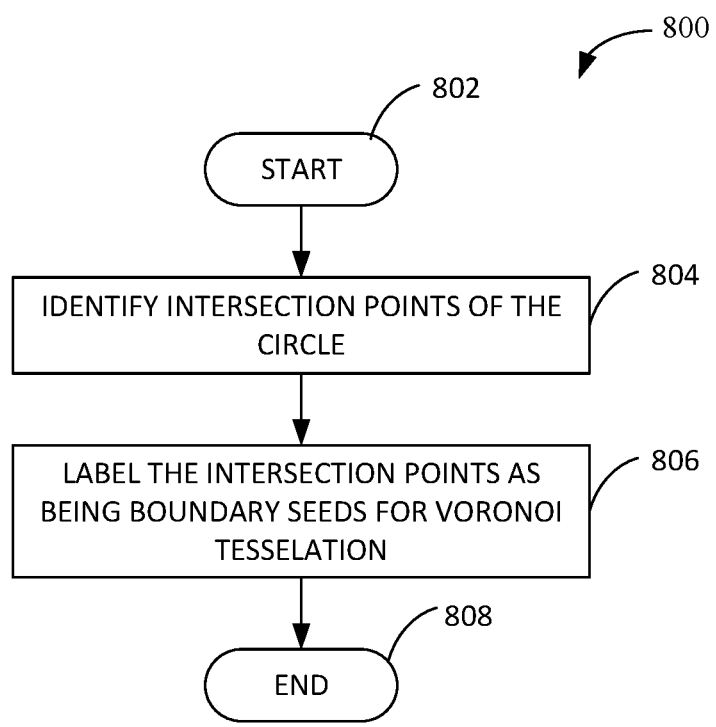
FIG. 8 is a flow diagram that illustrates an exemplary methodology for labeling intersection points as being boundary seeds for use in connection with generating a conforming Voronoi mesh in an arbitrarily-shaped enclosed domain.

Referring now to FIG. 8, another exemplary methodology 800 that is performed by the boundary seed identifier module 112 is illustrated. The methodology 800 starts at 802, and at 804 points of intersection of the circles (e.g., the circles 520-526 and 704-718) are identified. As illustrated in FIG. 7, each circle intersects with two other circles, such that each circle has four intersection points corresponding thereto. The boundary seed identifier module 112 identifies each of these intersection points. At 806, the intersection points are labeled as being boundary seeds for use by the tessellator module 116 when generating the Voronoi mesh. The methodology 800 completes at 808.

Figure 9:
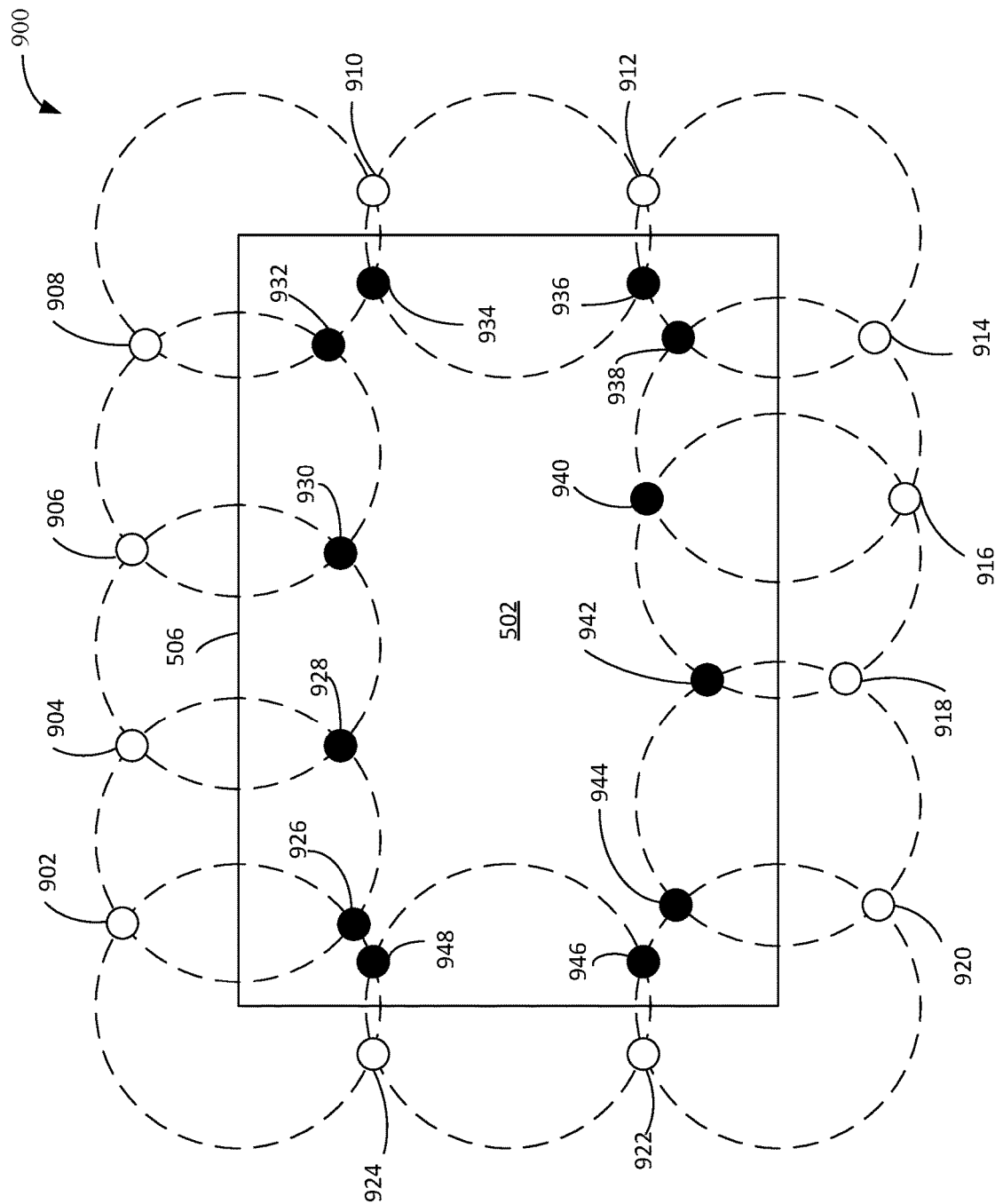
FIG. 9 is a schematic that depicts locations of seeds that are usable when constructing a conforming Voronoi mesh in an arbitrarily-shaped enclosed domain.

With reference to FIG. 9, an exemplary schematic 900 that depicts locations of boundary seeds identified by the boundary seed identifier module 112 is illustrated. In the example shown in FIG. 9, the boundary seed identifier module 112 identifies boundary seeds 902-948. The boundary seeds are in pairs, with each pair including a boundary seed inside the enclosed domain 502 and a boundary seed outside of the enclosed domain 502, and further wherein boundary seeds in a boundary seed pair are equidistant to any point on an edge that is between boundary seeds in the boundary seed pair. For example, the boundary seeds 902 and 926 form a boundary seed pair, wherein the boundary seed 902 is outside of the enclosed domain 502 and the boundary seed 926 is inside the enclosed domain 502, and further wherein the boundary seeds 902 and 928 are equidistant to any point on the edge 506 that is between the boundary seed 902 and the boundary seed 926. In other words, the boundary seeds 902 and 926 mirror each other about the edge 506.

Other boundary seeds in boundary seed pairs have the same "mirroring" property. Accordingly, when the tessellator module 116 constructs a Voronoi mesh using the boundary seeds 902-948, Voronoi facets shared by boundary seeds in boundary seed pairs are coincident with edges of the enclosed domain 502. In other words, a Voronoi cell of the boundary seed 926 will have a facet that is coincident with the edge 506 due to the boundary seeds 902 and 926 being equidistant to any point along the edge 506. Thus, for example, a facet of each Voronoi cell for the boundary seeds 928-934 will be coincident with a respective portion of the edge 506, where the facets collectively are coincident with an entirety of the edge 506. Therefore, it can be ascertained that a Voronoi mesh generated by the tessellator module 116 when utilizing the boundary seeds 902-948 to construct the Voronoi mesh will be a conforming Voronoi mesh with some of the facets of the Voronoi cells of the seeds 926-948 being coincident with the edges 504-510 of the enclosed domain 502.

In some applications, it may be desirable to cause the resultant conforming Voronoi mesh to have more Voronoi cells than those generated based solely on the boundary seeds 902-948. For instance, the numerical simulator module 118 can be configured to solve a partial differential equation (PDE) over the enclosed domain 502 based upon a Voronoi mesh, and inclusion of more Voronoi cells in the mesh can result in reduction in error in results of numerical simulation. Hence, the interior seed identifier module 114 can place additional seeds inside the enclosed domain 502 while ensuring that the additional seeds do not compromise the conformity of the resultant Voronoi mesh. In other words, the interior seeds positioned in the enclosed domain 502 by the interior seed identifier module 114 do not alter the facets that are coincident with the edges 504-510 of the enclosed domain.

Figure 10:
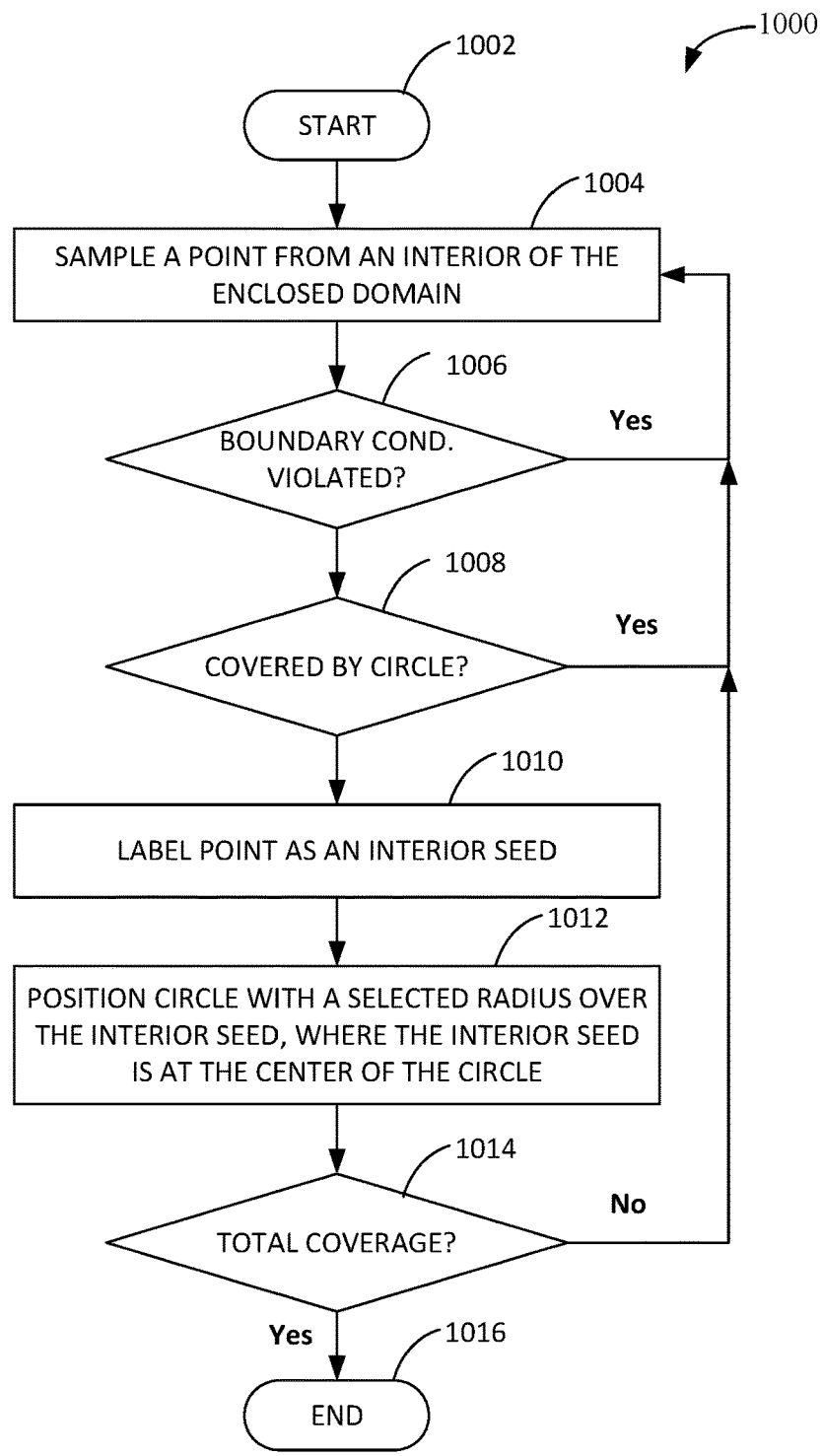
FIG. 10 is a flow diagram that illustrates an exemplary methodology for determining locations of interior seeds in an enclosed domain, wherein the seeds are employed to bound aspect ratios of at least some cells in a conforming Voronoi mesh.

With reference now to FIG. 10, an exemplary methodology 1000 that is performed by the interior seed identifier module 114 when placing interior seeds in an enclosed domain is illustrated. The methodology 1000 starts at 1002, and at 1004 a point from the interior of the enclosed domain is randomly sampled. At 1006, a determination is made regarding whether the point violates a boundary condition. In other words, the interior seed identifier module 114 ensures that the distance between the sampled point and any point along any facet that is coincident with the edges of the enclosed domain is greater than the distance between any point along the facet and its boundary seed. If it is determined, at 1006, that a boundary condition has been violated, the methodology returns to 1004. If the boundary condition is determined not to be violated at 1006, then the methodology 1000 continues to 1008, where a determination is made regarding whether the sampled point is covered by a circle. In other words, at 1008, determination is made regarding whether the sampled point is within some threshold distance of either a boundary seed or an interior seed. If, at 1008, it is determined that the sampled point is covered by the circle, then the methodology 1000 returns to 1004.

If it is determined at 1008 that the sampled point is not already covered by a circle, then the methodology 1000 continues to 1010, where the interior seed identifier module 114 labels the sampled point as being an interior seed to be used by the tessellator module 116 when generating the conforming Voronoi mesh. At 1012, the circle with a predefined radius is positioned over the interior seed labeled at 1010, wherein the interior seed is at the center of the circle (this ensures that the interior seed identifier module 114 does not place another interior seed too close to the interior seed). Thereafter, at 1014, a determination is made regarding whether there is total coverage in the enclosed domain. In other words, a determination is made as to whether each point in the enclosed domain is covered by a circle (e.g., whether each point in the enclosed domain is within a threshold distance of another point in the enclosed domain). If there is not total coverage, the methodology returns to 1004. When there is total coverage, the methodology 1000 completes at 1016.

Similar to the approach described above (with respect to covering the edges of the enclosed domain with circles), a hierarchical approach can be employed by the interior seed identifier module 114 when populating the interior of the enclosed domain with interior seeds. For example, initially, the interior seed identifier module 114 can sample a point from an entirety of interior of the enclosed domain. After some threshold number of consecutive samplings where the sampled point is covered by a circle, the interior seed identifier module 114 can partition the interior of the enclosed domain into multiple subspaces. For instance, the interior seed identifier module 114 can place a grid over the interior region of the enclosed domain. The interior seed identifier module 114 may then select a cell of the grid and ascertain whether each point in the cell is covered by a circle. When each point in the cell is covered by a circle, the interior seed identifier module 114 can discard the cell from further consideration; this process can be repeated to discard all cells that are entirely covered by one or more circles. The interior seed identifier module may then randomly select a cell from the remaining cells and sample a point from the cell. Thus, the methodology 1000 can be repeated over continuously decreasing cell sizes until total coverage is obtained.

After the interior seed identifier module 114 has placed the interior seeds on the interior of the enclosed domain (without violating the boundary condition), the tessellator module 116 can construct a Voronoi mesh using the boundary seeds and the interior seats as seeds for Voronoi cells in the Voronoi mesh.

Figure 11:
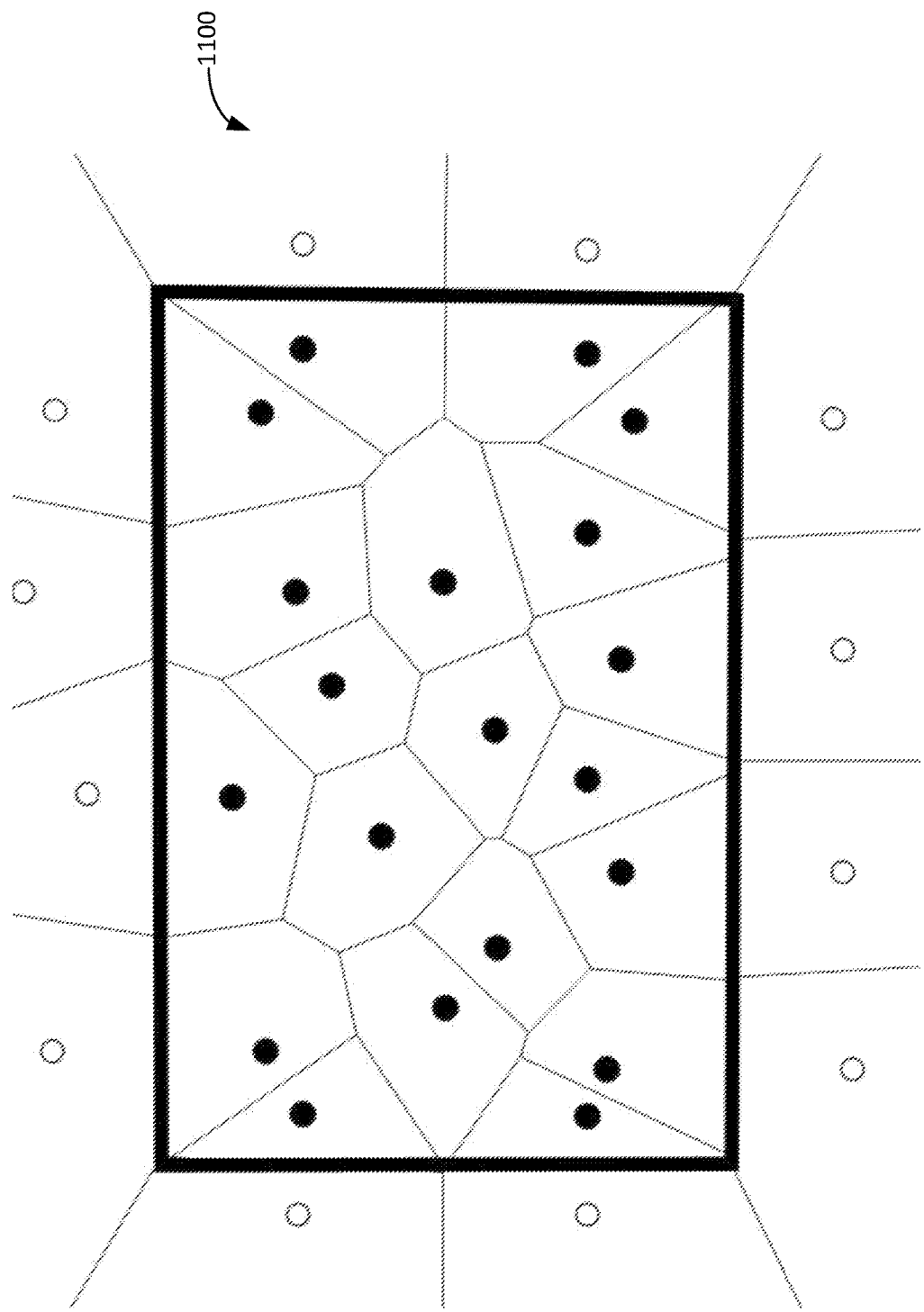
FIG. 11 depicts an exemplary Voronoi mesh.

Referring to FIG. 11, an exemplary conforming Voronoi mesh 1100 is illustrated, where the mesh is bounded by the enclosed domain. Hence, returning to FIG. 1, the tessellator module 116 generates a decomposed domain 120 and causes the decomposed domain 120 to be retained in the data store 106. The numerical simulator module 118 can access the decomposed domain 120, perform numerical simulation based on the decomposed domain 120, and generate simulation results 122 based on the decomposed domain. In an exemplary embodiment, the domain decomposition module 108 can utilize a k-d tree in the memory 104 when representing seeds and the resultant Voronoi mesh, where hyper-rectangles are defined using the seeds themselves.

Figure 12:
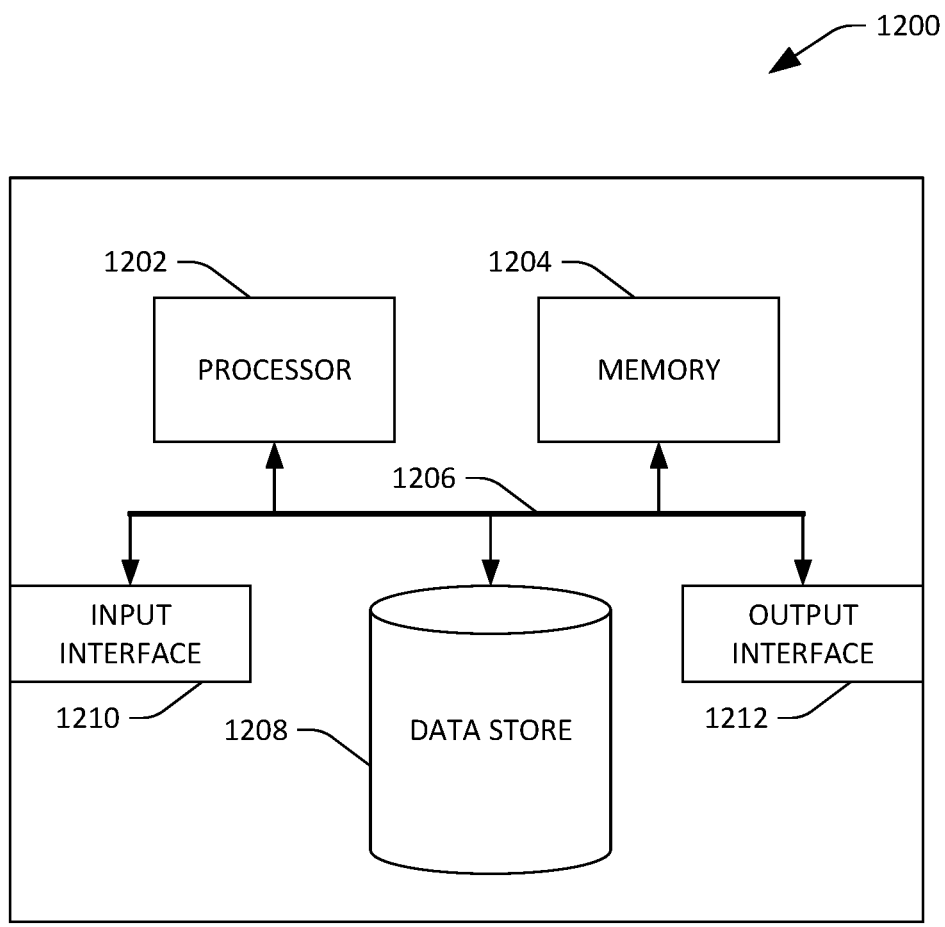
FIG. 12 depicts an exemplary computing system.

Referring now to FIG. 12, a high-level illustration of an exemplary computing device 1200 that can be used in accordance with the systems and methodologies disclosed herein is illustrated. For instance, the computing device 1200 may be used in a system that is configured to perform numerical simulations. By way of another example, the computing device 1200 can be used in a system that constructs conforming Voronoi meshes. The computing device 1200 includes at least one processor 1202 that executes instructions that are stored in a memory 1204. The instructions may be, for instance, instructions for implementing functionality described as being carried out by one or more components discussed above or instructions for implementing one or more of the methods described above. The processor 1202 may access the memory 1204 by way of a system bus 1206. In addition to storing executable instructions, the memory 1204 may also store seeds, Voronoi meshes, definitions of 2D enclosed geometric domains, etc.

The computing device 1200 additionally includes a data store 1208 that is accessible by the processor 1202 by way of the system bus 1206. The data store 1208 may include executable instructions, numerical simulation results, etc. The computing device 1200 also includes an input interface 1210 that allows external devices to communicate with the computing device 1200. For instance, the input interface 1210 may be used to receive instructions from an external computer device, from a user, etc. The computing device 1200 also includes an output interface 1212 that interfaces the computing device 1200 with one or more external devices. For example, the computing device 1200 may display text, images, etc. by way of the output interface 1212.

It is contemplated that the external devices that communicate with the computing device 1200 via the input interface 1210 and the output interface 1212 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 1200 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 1200 may be a distributed system. Thus, for instance, several devices may be in communication by way of a network connection and may collectively perform tasks described as being performed by the computing device 1200.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionally described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computing system comprising:
   a processor; and
   memory storing instructions that, when executed by the processor, cause the processor to perform acts comprising:
   receiving a computer-implemented definition of an enclosed geometric domain that includes a sharp corner, wherein the geometric domain is two-dimensional;
   determining locations of seeds for the enclosed geometric domain, wherein determining locations of the seeds for the enclosed geometric domain comprises:

identifying the sharp corner of the enclosed geometric domain;
centering a first circle having a first radius over the sharp corner of the enclosed geometric domain;
subsequent to centering the first circle over the sharp corner, selecting an edge that is partially covered by the first circle;
responsive to selecting the edge, sampling a point from the edge, wherein the point is uncovered by the first circle;
responsive to sampling the point from the edge, placing a second circle having a second radius centered on the point from the edge, wherein the second circle intersects with the first circle at two intersection points, and wherein the second radius is selected such that the second circle does not intersect any edges of the enclosed geometric domain other than the selected edge; and
labeling the two intersection points as being a subset of the seeds for the enclosed geometric domain;
decomposing the enclosed geometric domain into a conforming Voronoi mesh based on the locations of the seeds, wherein the conforming Voronoi mesh comprises Voronoi cells, and further wherein the conforming Voronoi mesh is bounded by the enclosed domain; and
performing a numerical simulation to generate simulation results, wherein the numerical simulation is based on at least one Voronoi cell in the Voronoi cells of the conforming Voronoi mesh.

2. The computing system of claim 1, wherein determining the locations of the seeds for the enclosed geometric domain further comprises:
repeating the acts of identifying and centering for each sharp corner of the enclosed geometric domain, wherein circles centered over sharp corners are prohibited from intersecting one another.

3. The computing system of claim 2, wherein determining the locations of the seeds for the enclosed geometric domain further comprises repeating the acts of selecting, sampling, placing, and labeling until all points of all edges of the enclosed geometric domain are covered by at least one circle.

4. The computing system of claim 3, wherein determining the locations of the seeds for the enclosed geometric domain further comprises:
sampling a point from an interior of the enclosed geometric domain;
determining that the point is at least a threshold distance from every other point labeled as being included in the seeds; and
responsive to determining that the point is at least the threshold distance from every other point labeled as being included in the seeds, labeling the point as also being included in the seeds.

5. The computing system of claim 4, wherein determining the locations of the seeds for the enclosed geometric domain further comprises repeating the acts of sampling a point from the interior, determining, and labeling until each point in the interior of the enclosed domain is within a threshold distance from a point labeled as being included in the seeds.

6. A method executed by a processor of a computing device, the method comprising:
receiving a computer-implemented definition of an enclosed geometric domain that includes a sharp corner, wherein the enclosed geometric domain is two-dimensional;
determining locations of seeds for the enclosed geometric domain, wherein determining locations of the seeds for the enclosed geometric domain comprises:
identifying the sharp corner of the enclosed geometric domain;
centering a first circle having a first radius over the sharp corner of the enclosed geometric domain;
subsequent to centering the first circle over the sharp corner, selecting an edge that is partially covered by the first circle;
responsive to selecting the edge, sampling a point from the edge, wherein the point is uncovered by the first circle;
responsive to sampling the point from the edge, placing a second circle having a second radius centered on the point from the edge, wherein the second circle intersects with the first circle at two intersection points, and wherein the second radius is selected such that the selected edge is the only edge of the enclosed geometric domain that is covered by the second circle; and
labeling the two intersection points as being a subset of the seeds for the enclosed geometric domain;
decomposing the enclosed geometric domain into a conforming Voronoi mesh based on the locations of the seeds, wherein the conforming Voronoi mesh comprises Voronoi cells, and further wherein the conforming Voronoi mesh is bounded by the enclosed geometric domain; and
performing a numerical simulation to generate simulation results, wherein the numerical simulation is based on at least one Voronoi cell in the Voronoi cells of the conforming Voronoi mesh.

7. The method of claim 6, wherein determining the locations of the seeds for the enclosed geometric domain further comprises:
repeating the acts of identifying and centering for each sharp corner of the enclosed geometric domain, wherein circles centered over sharp corners are prohibited from intersecting one another.

8. The method of claim 7, wherein determining the locations of the seeds for the enclosed geometric domain further comprises repeating the acts of selecting, sampling, placing, and labeling until all points of all edges of the enclosed domain are covered by at least one circle.

9. The method of claim 8, wherein determining the locations of the seeds for the enclosed geometric domain further comprises:
sampling a point from an interior of the enclosed geometric domain;
determining that the point is at least a threshold distance from every other point labeled as being included in the seeds; and
responsive to determining that the point is at least the threshold distance from every other point labeled as being included in the seeds, labeling the point as being included in the seeds.

10. The method of claim 9, wherein determining the locations of the seeds for the enclosed domain further comprises repeating the acts of sampling a point from the interior of the enclosed geometric domain, determining, and labeling until each point in the interior of the enclosed geometric domain is within a threshold distance from a point labeled as being included in the seeds.

11. A computer-readable storage medium comprising instructions that, when executed by a processor, cause the processor to perform acts comprising:

receiving a computer-implemented definition of an enclosed geometric domain that includes a sharp corner, wherein the enclosed geometric domain is two-dimensional;

determining locations of seeds for the enclosed geometric domain, wherein determining locations of the seeds for the enclosed geometric domain comprises:

identifying the sharp corner of the enclosed geometric domain;

centering a first circle having a first radius over the sharp corner of the enclosed geometric domain;

after centering the first circle over the sharp corner, selecting an edge, wherein the edge is partially covered by the first circle;

after selecting the edge, sampling a point from the edge, wherein the point is uncovered by the first circle;

after sampling the point, placing a second circle having a second radius centered on the point from the edge, wherein the second circle intersects with the first circle at two intersection points, and wherein the second radius is selected such that the second circle intersects no edges of the enclosed geometric domain other than the selected edge; and labeling the two intersection points as being a subset of the seeds for the enclosed geometric domain;

decomposing the enclosed geometric domain into a conforming Voronoi mesh based on the locations of the seeds, wherein the conforming Voronoi mesh comprises Voronoi cells, and further wherein the conforming Voronoi mesh is bounded by the enclosed geometric domain; and performing a numerical simulation to generate simulation results, wherein the numerical simulation is based on at least one Voronoi cell in the Voronoi cells of the conforming Voronoi mesh.

12. The computer-readable storage medium of claim 11, wherein determining the locations of the seeds for the enclosed geometric domain further comprises:

repeating the acts of identifying and centering for each sharp corner of the enclosed geometric domain, wherein circles centered over sharp corners are prohibited from intersecting one another.

13. The computer-readable storage medium of claim 12, wherein determining the locations of the seeds for the enclosed geometric domain further comprises repeating the acts of selecting, sampling, placing, and labeling until all points of all edges of the enclosed domain are covered by at least one circle.

14. The computer-readable storage medium of claim 13, wherein determining the locations of the seeds for the enclosed geometric domain further comprises:

sampling a point from an interior of the enclosed geometric domain;

determining that the point is at least a threshold distance from every other point labeled as being included in the seeds; and responsive to determining that the point is at least the threshold distance from every other point labeled as being included in the seeds, labeling the point as being included in the seeds.

\* \* \* \* \*